US009370048B2

(12) United States Patent
Rateiczak et al.

(10) Patent No.: US 9,370,048 B2
(45) Date of Patent: Jun. 14, 2016

(54) PANE HAVING ELECTRICAL CONNECTING ELEMENT

(75) Inventors: Mitja Rateiczak, Würselen (DE); Andreas Schlarb, Herzogenrath (DE); Bernhard Reul, Herzogenrath (DE); Stefan Ziegler, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 457 days.

(21) Appl. No.: 13/501,452

(22) PCT Filed: Dec. 3, 2010

(86) PCT No.: PCT/EP2010/068804
§ 371 (c)(1),
(2), (4) Date: Apr. 11, 2012

(87) PCT Pub. No.: WO2011/076540
PCT Pub. Date: Jun. 30, 2011

(65) Prior Publication Data
US 2012/0205152 A1 Aug. 16, 2012

(30) Foreign Application Priority Data
Dec. 22, 2009 (EP) .................................... 09180346

(51) Int. Cl.
*H01B 7/08* (2006.01)
*H05K 1/09* (2006.01)
*H05B 3/84* (2006.01)

(52) U.S. Cl.
CPC ........... *H05B 3/84* (2013.01); *H05B 2203/016* (2013.01); *Y10T 29/49117* (2015.01)

(58) Field of Classification Search
CPC ................................. H01B 7/08; H05K 3/429
USPC ......................... 174/117 F, 117 FF, 262, 266
See application file for complete search history.

(56) References Cited

U.S. PATENT DOCUMENTS 2,924,540 A 2/1960 D'Andrea
3,052,573 A 9/1962 Dumesnil
3,553,833 A 1/1971 Jochim et al.
(Continued)

FOREIGN PATENT DOCUMENTS

CN 1799285 A 7/2006
DE 103 92 500 T5 5/2005
(Continued)

OTHER PUBLICATIONS

PCT Search Report for International Application PCT/EP2010/068804 filed on Dec. 3, 2010 in the name of Saint-Gobain Glass France.
(Continued)

*Primary Examiner* — Chau N Nguyen
(74) *Attorney, Agent, or Firm* — Steinfl & Bruno LLP

(57) ABSTRACT

The invention relates to a pane, wherein an electrically conductive structure is applied to a glass pane. At least one intermediate layer is applied to the electrically conductive structure, at least one electrical connecting element is attached to the intermediate layer, and the intermediate layer, electrical connecting element and electrically conductive structure form at least one hollow space comprising an electrically conductive mass. A method for the production and use thereof is also described.

28 Claims, 10 Drawing Sheets

(56) References Cited

U.S. PATENT DOCUMENTS

Figure 1:
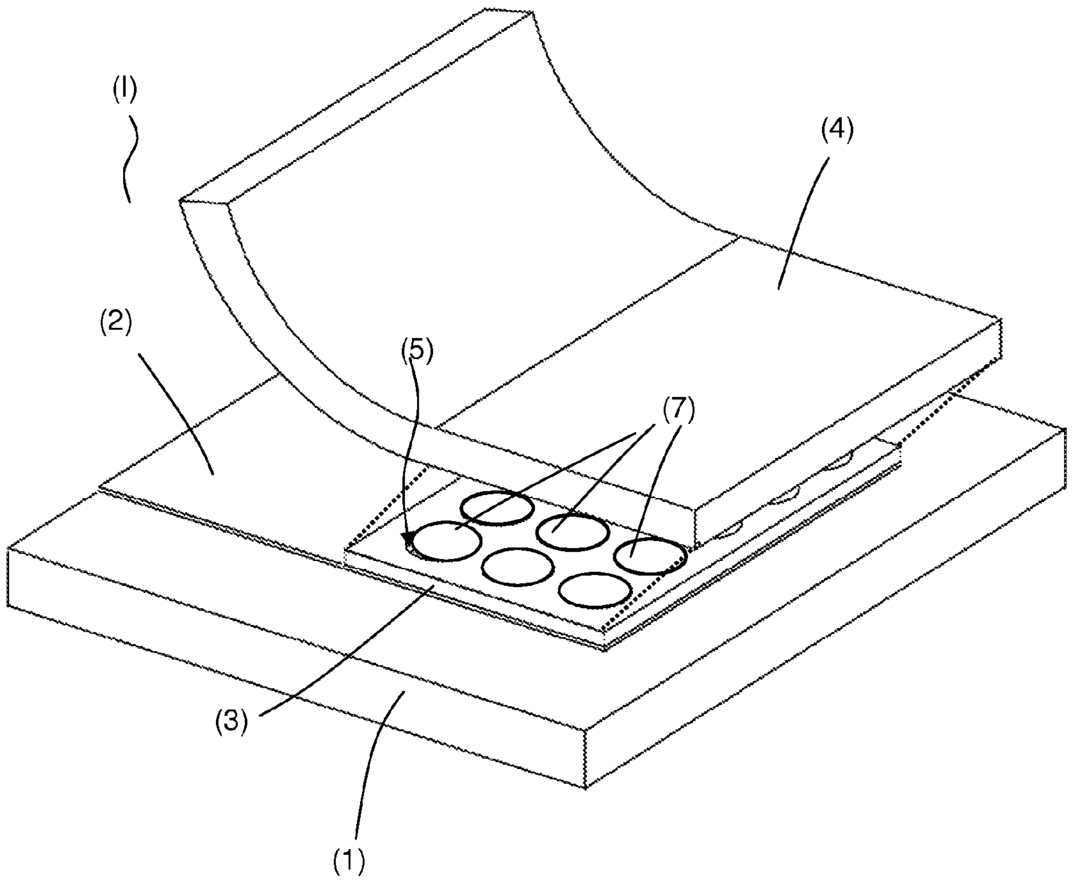

| | | | | | |
|---|---|---|---|---|---|
| 3,616,122 | A * | 10/1971 | Orcutt | 428/38 |
| 4,046,933 | A * | 9/1977 | Stefanik | 428/81 |
| 4,113,474 | A * | 9/1978 | Okano | 420/475 |
| 4,196,338 | A | 4/1980 | Edel | |
| 4,388,522 | A | 6/1983 | Boaz | |
| 4,618,088 | A | 10/1986 | Karla | |
| 5,391,411 | A * | 2/1995 | Rowland et al. | 428/34 |
| 5,436,412 | A * | 7/1995 | Ahmad et al. | 174/265 |
| 5,616,173 | A | 4/1997 | Okamoto et al. | |
| 5,879,206 | A | 3/1999 | Badgley et al. | |
| 6,019,272 | A | 2/2000 | Badgley et al. | |
| 6,024,904 | A * | 2/2000 | Nanri | 264/104 |
| 6,096,411 | A * | 8/2000 | Nakatani et al. | 428/209 |
| 6,207,259 | B1 * | 3/2001 | Iino et al. | 428/209 |
| 6,261,941 | B1 * | 7/2001 | Li et al. | 438/618 |
| 6,492,599 | B1 * | 12/2002 | Sugihara | 174/258 |
| 6,720,499 | B2 * | 4/2004 | Bokisa et al. | 174/257 |
| 6,953,897 | B2 * | 10/2005 | Marroquin et al. | 174/75 C |
| 6,996,902 | B2 * | 2/2006 | Suzuki et al. | 29/852 |
| 7,265,563 | B2 * | 9/2007 | Cram | 324/750.19 |
| 2005/0127895 | A1 * | 6/2005 | Rittmann | 324/117 R |
| 2007/0278673 | A1 * | 12/2007 | Shih-Ping et al. | 257/737 |
| 2008/0230254 | A1 * | 9/2008 | Kobayashi et al. | 174/117 FF |
| 2009/0159318 | A1 * | 6/2009 | Ikeguchi et al. | 174/257 |
| 2010/0294566 | A1 | 11/2010 | Reul | |

FOREIGN PATENT DOCUMENTS

| | | | |
|---|---|---|---|
| DE | 10 2007 059 818 | B3 | 4/2009 |
| FR | 2 519 477 | A1 | 7/1983 |
| GB | 1 159 390 | A | 7/1969 |
| JP | S60151980 | A | 8/1985 |
| JP | H071179 | A | 1/1995 |
| JP | 2006523917 | A | 10/2006 |
| JP | 2008218399 | A | 9/2008 |
| JP | 2009026500 | A | 2/2009 |
| JP | 2009054550 | A | 3/2009 |
| WO | 03/085697 | A2 | 10/2003 |
| WO | 2004/068643 | A1 | 8/2004 |
| WO | 2007/116088 | A1 | 10/2007 |
| WO | 2009/074267 | A1 | 6/2009 |

OTHER PUBLICATIONS

PCT Written Opinion issued on Jul. 10, 2012 for International Application PCT/EP2010/068804 filed on Dec. 3, 2010 in the name of Saint-Gobain Glass France (English and German).

First Office Action issued on Aug. 27, 2013 for Chinese Application 201080058857.9 filed on Dec. 3, 2010 in the name of Saint-Gobain Glass France.

Second Office Action issued on Mar. 21, 2014 for Chinese Application 201080058857.9 filed on Dec. 3, 2010 in the name of Saint-Gobain Glass France.

Third Office Action issued on Aug. 26, 2014 for Chinese Application 201080058857.9 filed on Dec. 3, 2010 in the name of Saint-Gobain Glass France.

First Office Action mailed on Mar. 25, 2014 for Japanese Application 2012-545199 filed on Dec. 3, 2010 in the name of Saint-Gobain Glass France.

Second Office Action mailed on Nov. 11, 2014 for Japanese Application 2012-545199 filed on Dec. 3, 2010 in the name of Saint-Gobain Glass France.

Search Report for European Application EP 09 18 0346 filed on May 27, 2010 in the name of Saint-Gobain Glass France.

"General Guidelines for the use of FERRO Silver pastes" retrieved from the web (http://www.ferro.com/Our+Products/ColorsGlass/Automotive/) on Oct. 26, 2015, 11 pages (PDF file appears dated Oct. 2007).

* cited by examiner

PANE HAVING ELECTRICAL CONNECTING ELEMENT

CROSS REFERENCE TO RELATED APPLICATIONS

The present application is the US national stage of International Application PCT/EP2010/068804 filed on Dec. 3, 2010, which, in turn, claims priority to European Patent Application 09180346.0 filed on Dec. 22, 2009.

The present invention relates to a pane with an electrical connection element, a method for its production and its use.

Electrical connection elements on panes with electrically conductive structures are known, for example, from WO 2007/116088 A1.

DE 10 2007 059 818 B3 discloses a flat-conductor connection element with an electrically conductive layer that is attached on an outer surface of a pane and at least one electrically insulating buffer layer is provided between one section of the electrically conductive layer with a freely exposed soldering surface, on the one hand, and the surface of the glass pane, on the other.

From DE 103 92 500 T5, methods and articles for application and retention of solder masses for the mechanical and electrical connection of electrical connection elements are known. A body with a plurality of holes formed therein supports a solder mass, wherein the solder mass is arranged over the holes.

The known solutions have the disadvantage that mechanical stresses arise between an electrical connection element and the glass pane that can lead to damage up to and including breakage of the glass panes.

The object of the present invention is to provide an improved mechanical connection of electrical connection elements with panes that is durably stable electrically.

A further object of the invention is to find a new method for the production of panes with electrical connection elements as well as a new use thereof.

The objects are accomplished through the characteristics set forth in the independent claims 1, 11, and 15. Preferred embodiments of the invention are indicated through the characteristics of the subclaims. The invention comprises a pane wherein an electrically conductive structure is applied on a glass pane, at least one intermediate layer is applied on the electrically conductive structure, at least one electrical connection element is applied on the intermediate layer, and wherein the intermediate layer, electrical connection element, and electrically conductive structure form at least one hollow space, and the hollow space includes an electrically conductive mass.

Advantages of the pane according to the invention reside, among other things, in that critical mechanical stresses are minimized on the glass pane by means of the intermediate layer between the electrical connection element and the electrically conductive structure.

Critical mechanical stresses result from the amount and direction of point, line, and area forces, shear forces, as well as torsional forces that can lead, due to loads during production or use of the panes, to damage or breakage on the panes.

Temperature-change induced mechanical stresses are increased in particular with differences in the coefficients of thermal expansion and the viscosity of the materials used.

The mechanical stresses are particularly critical when the connection of glass panes to electrical connection elements occurs at temperatures >60° C., particularly at >120° C. and very particularly >158° C.

It is advantageous according to the invention for the hollow space to be completely surrounded by the intermediate layer. The hollow space then forms at least one gap within the intermediate layer. The gap is delimited by the electrically conductive structure, the electrical connection element, and the intermediate layer.

Hollow spaces are advantageous according to the invention since support cavities are provided for an electrically conductive mass. The shaping of the electrically conductive mass is established by the shape of the hollow spaces, the wetting of the electrically conductive mass inside the hollow spaces, and the viscosity of the electrically conductive mass during production and during use. Critical mechanical stresses are prevented.

The shape and the volume of the hollow spaces are determined in particular by the shape and volume of the intermediate layer, as well by the shape of the electrical connection element.

Inside the hollow spaces, the electrically conductive mass is held in a defined geometry in all three spatial directions, and a durable, electrical connection is obtained between an electrical connection element and an electrically conductive structure.

In a particularly preferred embodiment of the invention, the electrically conductive mass is arranged inside the hollow space. No electrically conductive mass is found in the regions outside the hollow spaces. The regions outside the hollow spaces are formed by the outside edges of the hollow spaces and/or projections of the outside edges. No electrically conductive mass is discernible upon observation of the pane from above. The electrically conductive mass ends, preferably, flush with the outside edges of the hollow spaces because of its shape, wetting characteristics, and viscosity.

In a preferred embodiment, the intermediate layer according to the invention has a thickness of 0.5 μm to 1 mm, preferably 1 μm to 500 μm, and particularly preferably 10 μm to 300 μm.

In another preferred embodiment of the invention, the hollow spaces have a diameter or area equivalent of 0.1 mm to 2 mm and preferably of 0.2 mm to 1 mm.

In an alternative embodiment, the hollow spaces have a diameter or area equivalent of 2 mm to 25 mm and preferably of 3 mm to 10 mm and very particularly preferably of 7.5 mm to 8.5 mm.

The hollow spaces preferably have round, elliptical, rectangular, or polygonal shapes that form, according to the invention, a shape of the electrically conductive mass that effects an improved mechanical connection of electrical connection elements with panes that is durably stable electrically.

The area equivalents of the hollow spaces are calculated from the diameter based on a round shape of the hollow spaces and can be carried over to areas with elliptical, rectangular, or polygonal, or all shapes that effect an improved mechanical connection of electrical connection elements with panes that is durably stable electrically.

Particularly advantageous according to the invention are intermediate layers that effect as many points of applied force as possible between an electrically conductive mass and an electrically conductive layer.

In another preferred embodiment, the hollow spaces in the intermediate layer have a cross-section that is formed from a region facing the electrical connection element, an intermediate region, and a region facing away from the electrically conductive structure. The shapes of the hollow spaces viewed from above can be configured differently over the depth of the hollow spaces. The areas have, preferably, round, elliptical, or rectangular shapes. The electrically conductive mass can form a particularly advantageous shape in the hollow spaces in order to reduce the mechanical loads on the electrically conductive structure and the glass pane. This is particularly advantageous if the electrically conductive mass does not emerge from the hollow spaces.

In another preferred embodiment, the electrically conductive mass is held inside the hollow spaces by the wetting characteristics and viscosity of the electrically conductive mass. The wetting characteristics or capillary forces are established by the interfacial energies of the materials of the electrically conductive mass, the intermediate layer, the connection element, the electrically conductive structure, the glass pane, and/or the surrounding atmosphere.

It is particularly preferable according to the invention for the electrically conductive mass to form a concave meniscus inside the hollow space.

Very particularly preferably, the concave meniscus is established through a very small wetting angle of the electrically conductive mass inside the hollow space.

The viscosity of the electrically conductive mass depend on the material and the temperature. It is advantageous according to the invention to effect the shaping in the temperature range between the liquidus temperature and the solidus temperature when a major change in the viscosity of the electrically conductive mass is observed.

The intermediate layer according to the invention is particularly advantageous when the region of the gaps facing the electrical connection element has a smaller diameter or a smaller area than the region facing the electrically conductive structure.

In another embodiment of the intermediate layers according to the invention, the edge shapes on the gaps and the shape of the electrical connection element are adapted to the flow characteristics, the viscosity, and the wetting characteristics of the electrically conductive mass. Preferably, the edge regions are implemented right angled, rounded, or highly rounded.

Particularly preferably, the electrically conductive structure, the intermediate layer, and the electrical connection element form a hyperbolic funnel that tapers from the electrically conductive structure to the electrical connection element. Very particularly preferably, the gaps are filled with an electrically conductive mass only in the edge region of the hyperbolic funnel. The shape of the electrically conductive mass is predefined by the wetting characteristics and the viscosity of the electrically conductive mass on the intermediate layer and the electrical connection element.

This is particularly advantageous in order to purposefully discharge expanding gases from the hollow spaces during production.

The mechanical forces run, according to the invention, between the electrically conductive mass and the electrically conductive structure or the glass pane in a shallow attack angle.

According to the invention, electrically conductive masses are used that, because of their shape, viscosity, and their aggregate state, transmit no critical forces to the electrically conductive structure and/or glass pane.

Viscosity in the context of the invention is also an expression of ductility of the electrically conductive mass in the solid aggregate state.

It is particularly advantageous according to the invention for the mechanical connection between the connection element and the glass pane to be made via the intermediate layer and for the solidus temperature of the electrically conductive mass to be less than 158° C., preferably less than 120° C. and very particularly preferably less than 65° C.

An alternative embodiment of the invention is also particularly advantageous if the mechanical connection is made between the connection element and the glass pane via the electrically conductive mass and the solidus temperature of the electrically conductive mass is 159° C. to 220° C.

In another preferred embodiment of the invention, the electrically conductive mass includes a conductive liquid, metal alloy, and/or composite materials, preferably metal alloys with silver, tin, zinc, indium, bismuth, and/or gallium, and particularly preferably metal alloys with 60 wt.-% to roughly 98 wt.-% gallium, 15% wt.-% to 70% wt.-% indium, 50 wt.-% to 98 wt.-% tin, 10 wt.-% to 80 wt.-% zinc, 2 wt.-% to 10 wt.-% silver, and/or 30 wt.-% to 70 wt.-% bismuth.

The electrically conductive masses with a solidus temperature of <65° C. include preferably 60 wt.-% to roughly 98 wt.-% gallium.

The electrically conductive masses with a solidus temperature greater than/equal to 65° C. and less than 158° C. include very particularly preferably 15% wt.-% to 70% wt.-% indium and/or 30 wt.-% to 70 wt.-% bismuth.

The electrically conductive masses with a solidus temperature greater than/equal to 158° C. include very particularly preferably 50 wt.-% to 98 wt.-% tin.

The electrically conductive masses are, according to the invention, preferably lead-free.

According to the invention, conductive spongy, gridlike, or inorganic or organic composites or mixtures may also be included in the electrically conductive mass. Examples of this are wool-like shaped metals such as silver wool.

The electrically conductive mass can, because of a low solidus temperature, be at times or permanently liquid at customary ambient temperatures. With a low viscosity of the electrically conductive mass, flow inside the hollow spaces is prevented by the shape and wetting characteristics. The electrical connection persists. The mechanical connection between the electrical connection element and the electrically conductive structure and/or the glass pane takes place at times or permanently, completely or partially via the intermediate layer.

A liquid or low-viscosity or high-ductility electrically conductive mass is particularly advantageous since no critical mechanical loads emerge between the electrically conductive mass and the electrically conductive structures and/or glass pane.

The glass panes are prestressed, partially prestressed, or non-prestressed monolithic glass panes or composite glass panes made of silica glass, and preferably non-prestressed or partially prestressed composite glass panes. The glass panes have a thickness of 1 mm to 6 mm, preferably of 1.8 mm to 4 mm.

The glass panes can be completely or partially coated with a covering screenprint, preferably in the edge region, and particularly preferably in the region of the electrical connection elements.

The electrically conductive structures on panes are preferably conducting paths with heating conductors and/or antenna conductors. The electrically conductive structures are preferably connected in the edge region of the glass pane with electrical connection elements.

Electrical connection elements produce a durable mechanical coupling and electrical connection between electrical conductors of, for example, onboard electrical systems in motor vehicles and the electrical conductive structures on the pane. The electrical connection elements are preferably configured as flat conductors or so-called rigid connectors. Rigid connectors have high rigidity because of their material characteristics, material thickness, and shape.

In another embodiment of the invention, long unstable and aging electrically conductive masses are protected from environmental influences by corrosion protection. The corrosion protection is preferably liquid and/or electrically conductive.

In another embodiment of the invention, the intermediate layer includes temperature-stable polymer layers, ceramic screen printing pastes, solder resists, and/or adhesive strips, preferably polyacrylate, cyanoacrylate, methyl methacrylate, silane and siloxane cross-linking polymers, epoxy resin, polyurethane, polychloroprene, polyamide, acetate, silicone adhesive, polyethylene, polypropylene, polyvinyl chloride, polyamide, polycarbonate, polyethylene terephthalate, polyethylene naphthalate, polyimides, polyethylene terephthalate, polyetherimides, polybenzimidazoles, polytetrafluoroethylene, thermally hardenable adhesives, their copolymer, and/or mixtures thereof, and particularly preferably polyimides or polytetrafluoroethylene.

According to the invention, preferably, materials are used in the intermediate layer that are not wetted by the electrically conductive mass. The materials have, preferably, a low interfacial energy. Particularly well-suited for this are polyimides, polytetrafluoroethylene, or solder resists, as well as composite materials with polyimides or solder resists.

In another embodiment of the invention, the intermediate layer according the invention is constructed from a plurality of layers, wherein the intermediate layer and the surfaces of the electrical connection element and the electrically conductive structure are brought into positive contact via adhesive layers.

Particularly preferably, according to the invention, the intermediate layers include additional connection cavities, that connect the hollow spaces to each other or to the edge of the intermediate layer. This is particularly advantageous for the discharge of gaseous products during the mechanical and electrical connecting of the electrical connection element to the electrically conductive structure. The connection cavities are, according to the invention, either not or hardly filled or wetted with electrically conductive mass.

In the method of production of a pane according the invention, an electrically conductive structure is applied on a glass pane, an intermediate layer is applied on the electrically conductive structure and/or glass pane or an electrical connection element, an electrically conductive mass is applied on the electrical connection element or on the electrically conductive structure, the electrical connection element is mechanically connected via the intermediate layer to the electrically conductive structure and/or glass pane, wherein at least one hollow space is formed, and the electrically conductive mass is electrically connected inside at least one hollow space to the electrical connection element and the electrically conductive structure.

In a preferred embodiment, the intermediate layer is applied on the electrically conductive structure, and the electrically conductive mass is applied on the electrical connection element.

In another preferred embodiment of the method according to the invention, the intermediate layer is applied on the electrically conductive structure, electrical connection element, and/or glass pane by means of at least one of the methods screen printing, spraying, curtain coating, or roller coating, adhesion. With these methods, the intermediate layer with the gaps can be realized in a simple manner with the necessary precision.

In another preferred embodiment of the method according to the invention, the mechanical connection takes place through mechanical clamping, soldering, and/or adhesion of the electrical connection element to the electrically conductive structure and/or glass pane, preferably to the glass pane. The temperatures at the time of connection are, according to the invention, preferably below 158° C., particularly preferably below 120° C. and very particularly preferably below 60° C.

Very particularly preferably, the electrical connection element is simultaneously mechanically connected to the electrically conductive structure and/or glass pane during the electrical connection, preferably by means of thermal activation of the adhesive action of the intermediate layer. The activation of the adhesive action of the intermediate layer can occur, for example, with the soldering of the electrically conductive mass.

Exemplary embodiments of the invention are schematically depicted in FIGS. 1 to 10 of the drawings and are described in detail in the following.

They depict

Figure 2:
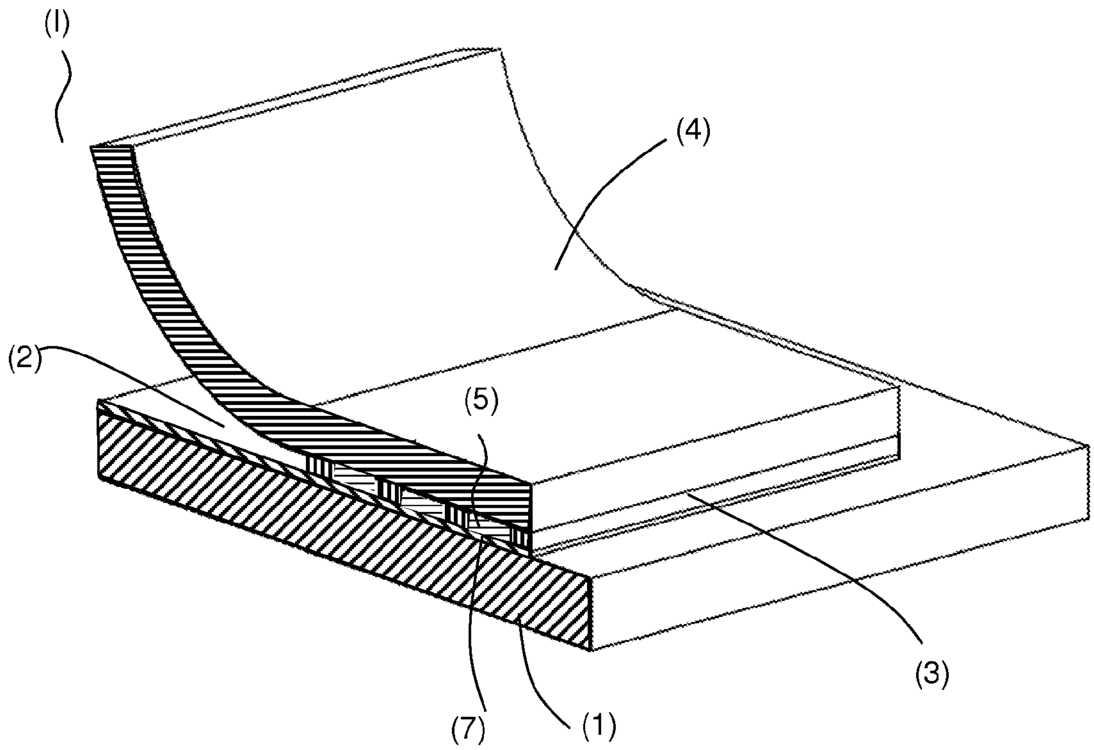
Figure 3:
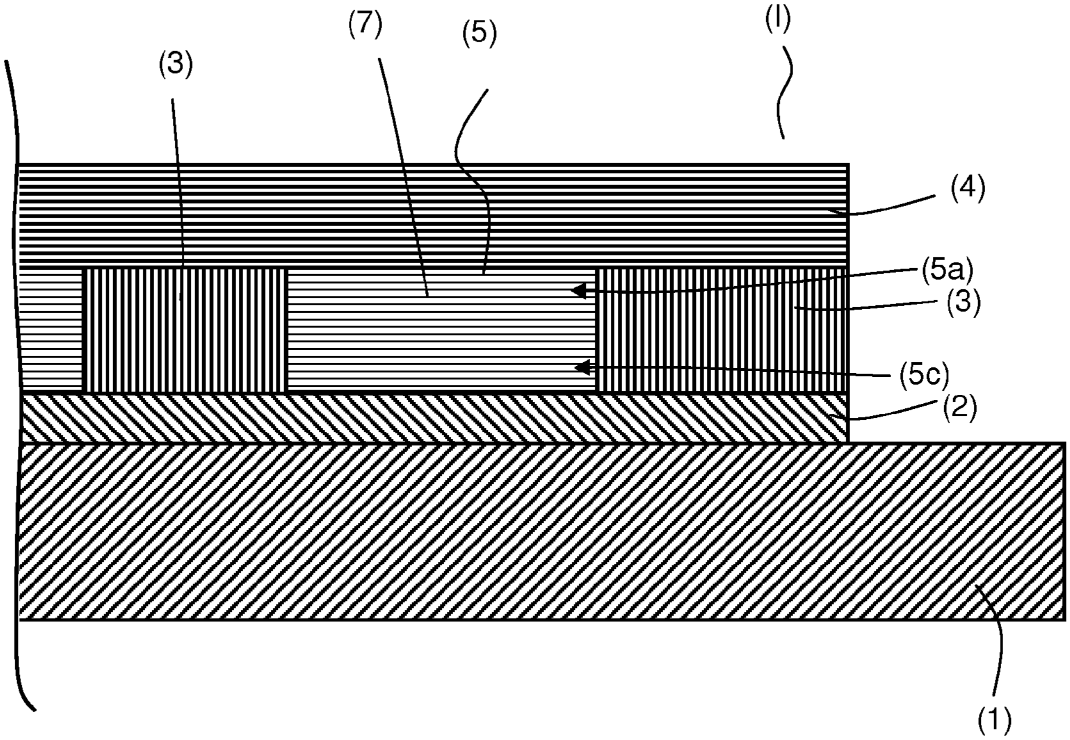
Figure 4:
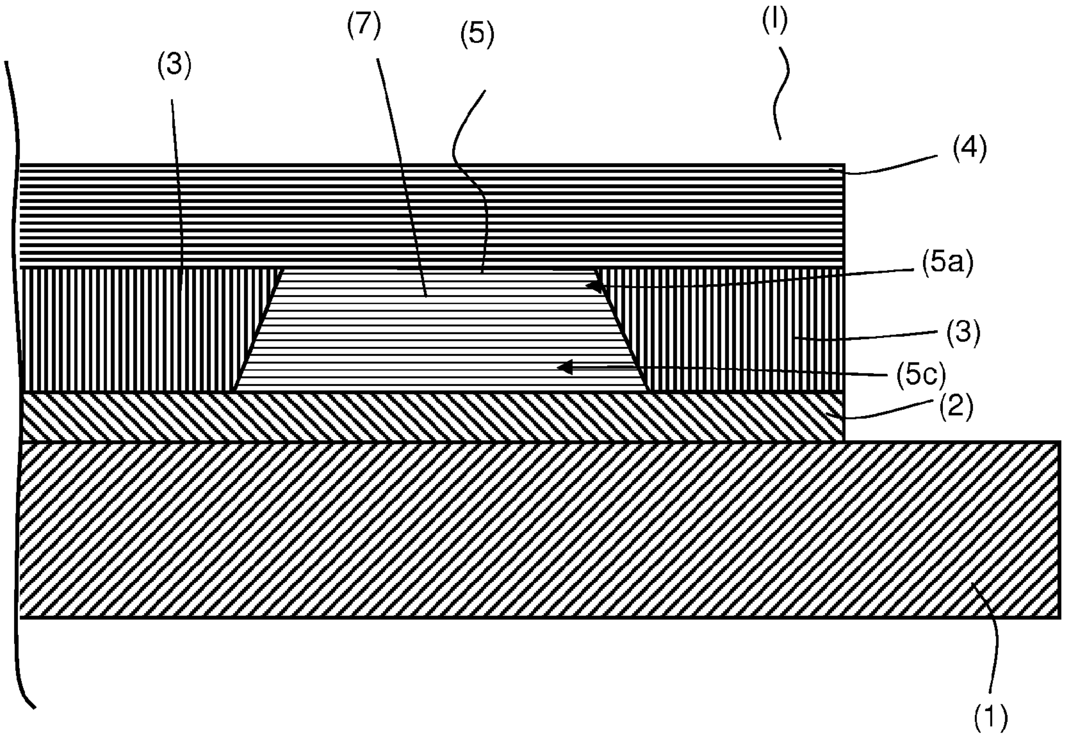
Figure 5:
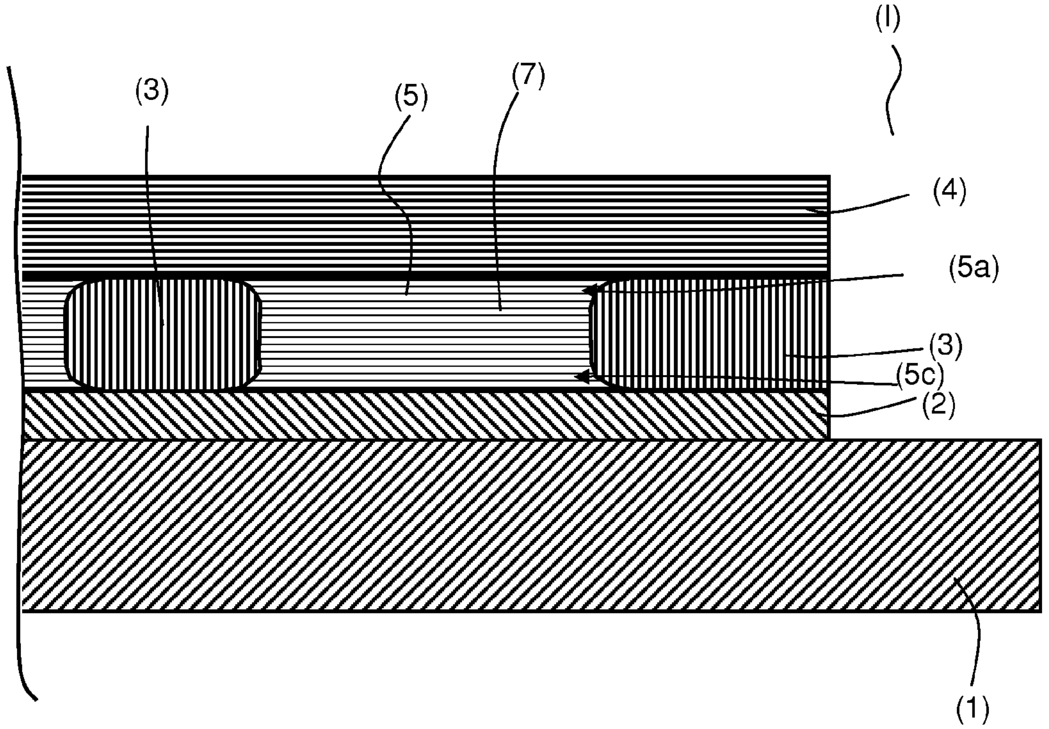
Figure 6:
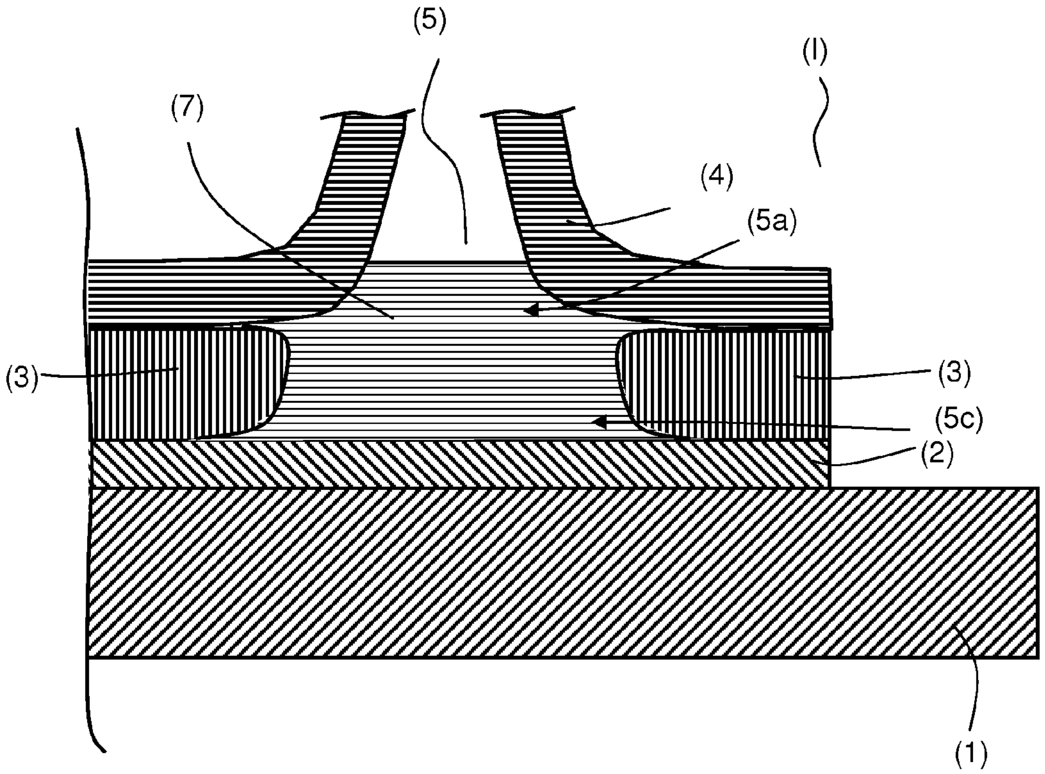
Figure 7:
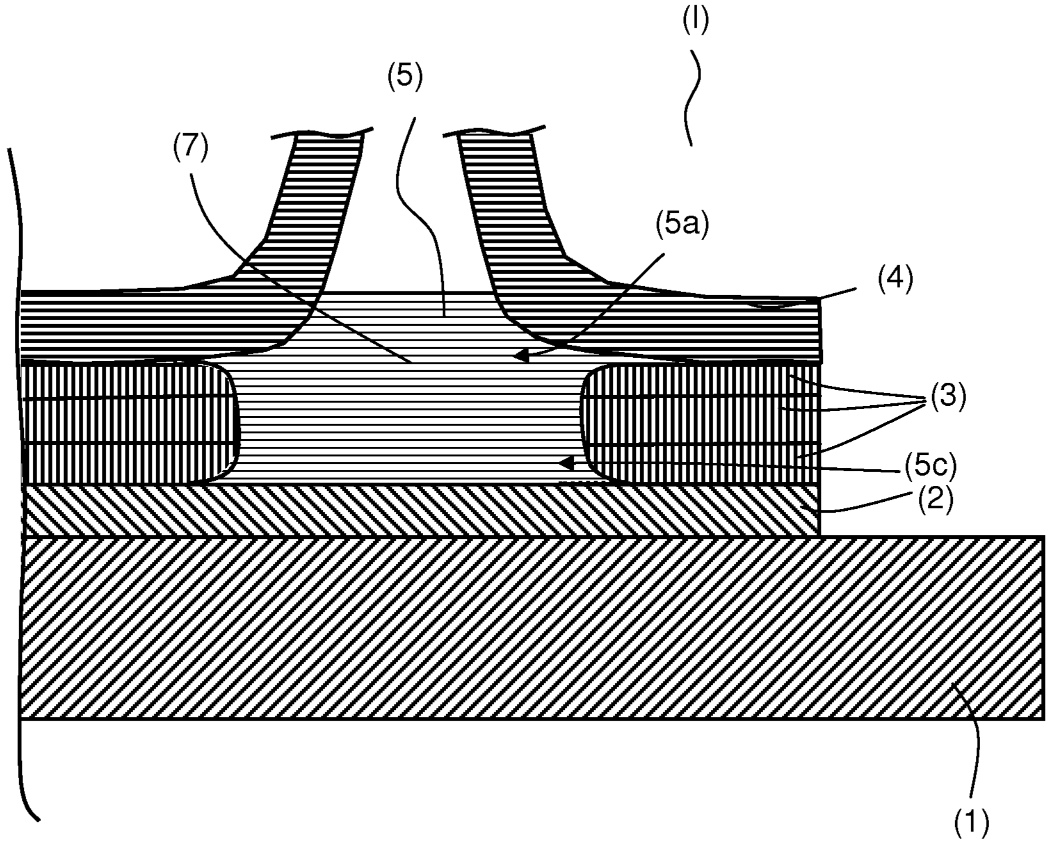
Figure 8:
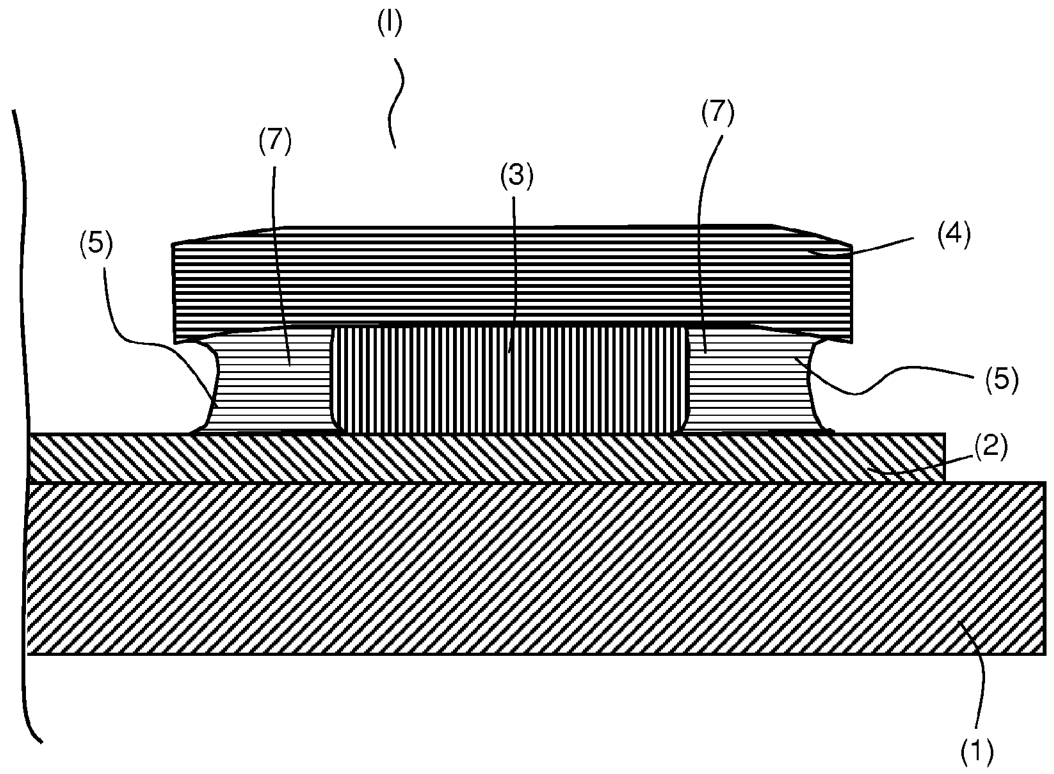
Figure 9:
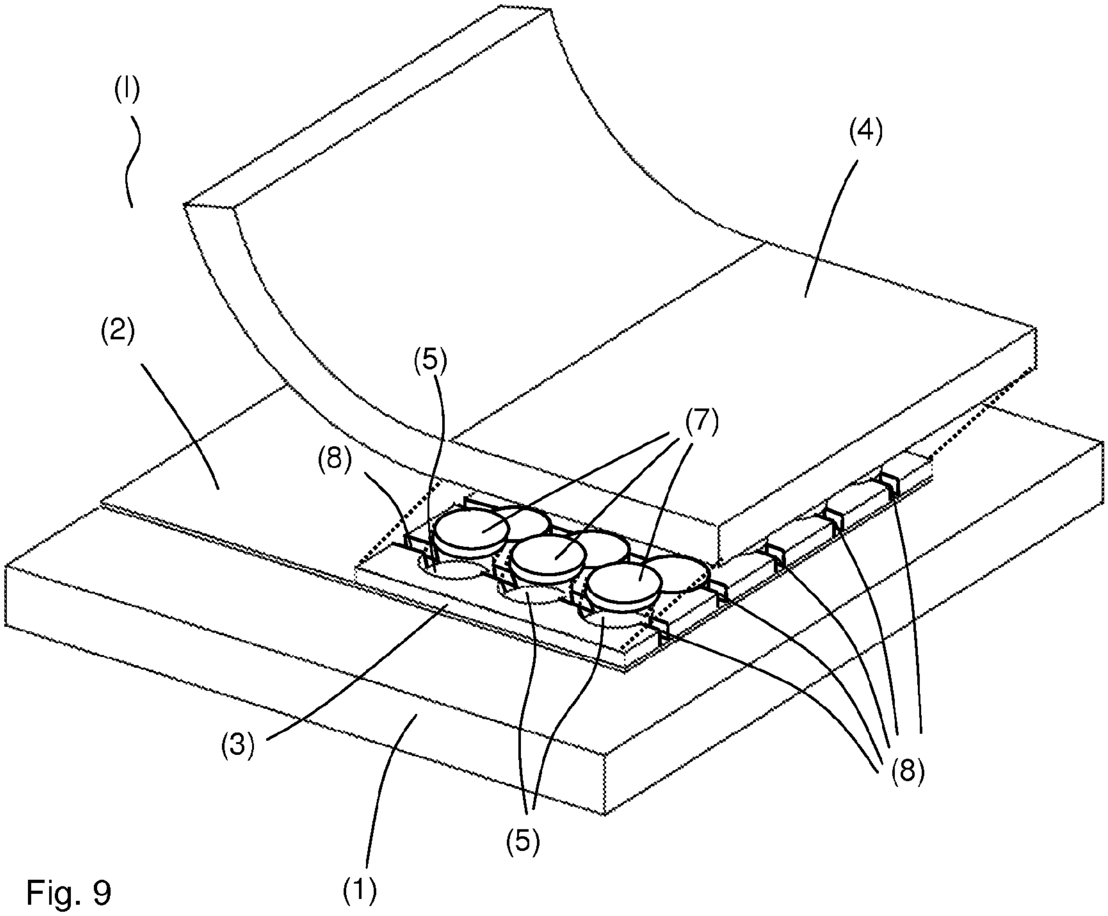
Figure 10:
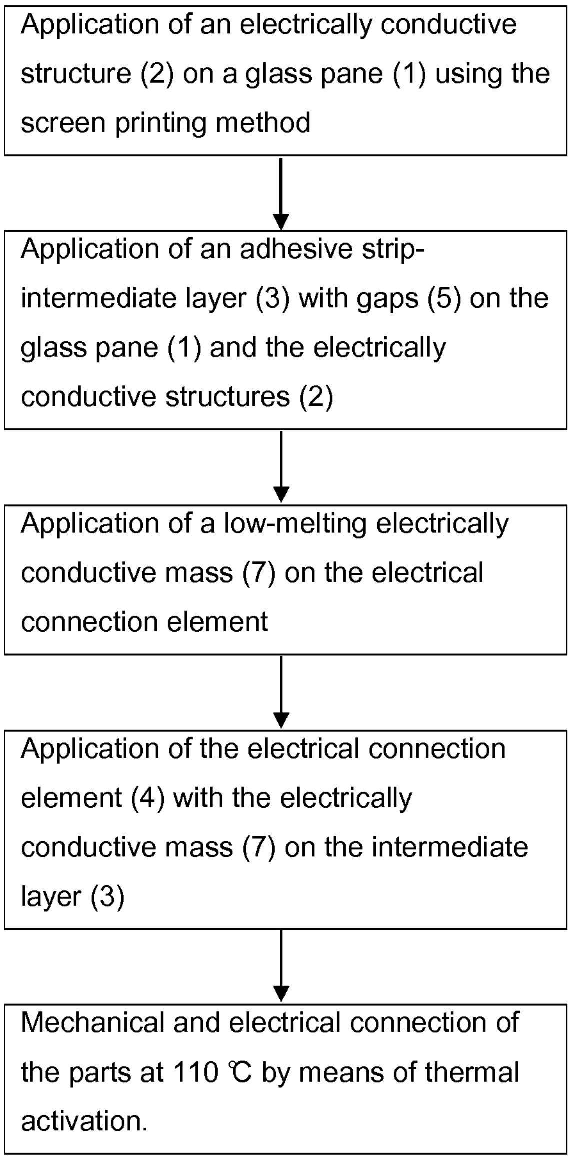

FIG. 1 an exploded perspective depiction of a pane (I) according to the invention, FIG. 2 a cross-section through a perspective depiction of a pane according to the invention according to FIG. 1, FIG. 3 a detail-cross-section through a pane (I) according to the invention according to FIG. 2, FIG. 4 a detail-cross-section through a preferred embodiment of the pane (I) according to the invention, FIG. 5 a detail-cross-section through another preferred embodiment of the pane (I) according to the invention, FIG. 6 a detail-cross-section through another preferred embodiment of the pane (I) according to the invention, FIG. 7 a detail-cross-section through another preferred embodiment of the pane (I) according to the invention, FIG. 8 a detail-cross-section through another preferred embodiment of the pane (I) according to the invention, FIG. 9 an exploded perspective depiction of an alternative embodiment of the pane (I) according to the invention, and FIG. 10 a flow diagram of an exemplary embodiment of the method according to the invention.

FIGS. 1 to 3 depict the connection region of a pane (I) according to the invention with an electrical connection element (4) in various depictions. An electrically conductive structure (2) was printed as a heating conductor using a silver-containing silk screen paste on a non-prestressed silicate glass pane (1). On a subregion of the the electrically conductive structure (2) on the edge of the glass pane (1), there was a 130-μm-thick intermediate layer (3) made of an adhesive strip with acrylic and polyimide. A plurality of round gaps (5) with a diameter of 1 mm were made in the adhesive strip. The diameter was constantly 1 mm from the region (**5*a*) facing the electrical connection element (4) to the region (5*c*) facing the electrically conductive structure. On the intermediate layer (3), there was an electrical connection element (4), configured as a flat conductor that was connected via a conductor (not shown) with the onboard electrical system (likewise not shown) of the motor vehicle. The gaps (5), subregions of the electrically conductive structure (2) and of the electrical connection element (4) formed hollow spaces (5) for an electrically conductive mass (7). The electrically conductive mass (7) was a low-viscosity, high-ductility lead-free solder including 67 wt.-% bismuth and 33 wt.-% indium with a solidus temperature of 110° C. The shape of the electrically conductive mass (7) was defined by the shape of the hollow spaces (5) and the wetting characteristics as well as the properties of the electrically conductive mass (7). The electrically conductive structure (2) was durably connected electrically via the electrically conductive mass (7) to the electrical connection element (4). The electrically conductive structure (2) was durably connected mechanically via the adhesive intermediate layer (3) to the electrical connection element (4). Compared to the prior art, the pane (I) according to the invention presented an improved mechanical connection between the electrical connection element (4) and the glass pane (1). Non-critical points of applied force were formed between the electrically conductive structure (2), the electrically conductive mass (7), the intermediate layer (3), and the electrical connection element (4). The amount and the direction of the mechanical forces that could result in damage to the electrically conductive structures (2) or the glass pane (1**) were minimized. Thus, the pane (I) was durably protected.

In an alternative embodiment according to the invention, the pane (I) included an electrical connection element (4) with a 0.8-mm-thick and 14×24 $mm^2$ copper plate with silver coating. The 14×24 $mm^2$ intermediate layer (3) had a thickness of 250 μm and comprised two square 6×6 $mm^2$ gaps (5) with rounded corners. The intermediate layer (3) extended beyond the electrically conductive structure (2) frame-like with a width of 8 mm. The hollow spaces (5) formed, with the electrical connection element (4) and the electrically conductive structure (2), a hollow space (5) that were partially filled with an electrically conductive mass (7) with 68 wt.-% gallium and 22 wt.-% indium. The electrically conductive mass (7) was liquid above −19° C. and was prevented from flowing by the gap. The electrical connection element (4) was durably connected electrically via the electrically conductive mass (7) to the contact region of the electrically conductive structure (2). The electrical connection element (4) was adhered to the glass pane (1) and durably connected mechanically to the glass pane (1) via the part of the intermediate layer (3) extending beyond the electrically conductive structures (2). Because of the liquid state of the electrically conductive mass (7), the mechanical stresses were completely conducted through the intermediate layer (3) and critical forces between the electrical connection element (4) and the glass pane (1) were not observed.

FIG. 4 depicts a preferred embodiment in continuation of the exemplary embodiment of FIGS. 1 to 3. The intermediate layer (3) was implemented as a solder-temperature-resistant polyimide film with a thickness of 100 μm. The intermediate layer (3) was applied with adhesive between the flat conductor (4) and the electrically conductive structure (2). The hollow spaces (5) were implemented circular in shape. The gaps in in the region (5*a*) facing the electrical connection element (4) had a cross-section of 0.8 mm; the hollow spaces (5) in the region (5*c*) facing the electrically conductive structure (2) and the pane (1) had a cross-section of 1.2 mm. The electrically conductive mass (7) formed a hyperbolic inverse funnel shape in the gap (5). The amount and the direction of the mechanical forces that could result in damage to the electrically conductive structures or the pane were minimized.

FIG. 5 depicts an alternative embodiment in continuation of the exemplary embodiment of FIGS. 1 to 3. The intermediate layer (3) was implemented as a solder-temperature-resistant polyimide film with a thickness of 100 μm. The hollow spaces (5) were likewise implemented circular in shape with a diameter of 5 mm. The cross-section of the intermediate layer (3) in the region of the hollow spaces (5) was implemented rounded on the upper edge (5*a*) toward the electrical connection element (4) and on the lower edge (5*c*) toward the contact region of the electrically conductive structure (2). The intermediate layer (3) was applied with adhesive between the electrical connection element (4) and the electrically conductive structure (2). This formed a hollow space (5) that enabled an improved mechanical and electrical connection between the electrical connection element (4) and the electrically conductive structure (2). The mechanical forces between the electrically conductive mass (7) and the electrically conductive structure (2) on the glass pane (1) had a shallow attack angle. Damages to the pane (I) according to the invention could be prevented.

FIG. 6 depicts, in the further improvement of the exemplary embodiment according to FIG. 5, a chimney-like configuration of the hollow space (5) through an adapted shaping of the electrical connection element (4). With this design, it was possible to improve the temperature distribution in the cooling process and the outgassing of soldering flux in the soldering process. The hollow space (2) was adapted in roughly the shape of a hyperbolic funnel. The surface and the diameter of the region (5*a*) toward the electrical connection element (4) were smaller than the surface and the diameter of the region (5*c*) facing the electrically conductive structure (2). Thus, an intermediate layer (3) with hollow spaces (5) was discovered that enabled, in a simple manner, an improved mechanical and electrical connection between the electrical connection element (4) and the contact region of the electrically conductive structure (2).

FIG. 7 depicts, in the further improvement of the exemplary embodiment according to FIG. 5, an intermediate layer (3) that was designed as a composite of layers. A layer of temperature-resistant polyimide was bordered by an upper and lower cyanoacrylate adhesive layer. Due to the layer construction with adhesive layers, a particularly advantageous positive contact was formed between the electrical connection element (4), the intermediate layer (3), and the electrically conductive structure (2). The mechanical forces between the electrically conductive mass (7) and the electrically conductive structure (2) on the glass pane (1) had a shallow attack angle. Damages to the electrically conductive structure (2) or the glass pane (1) were prevented.

FIG. 8 depicts an alternative embodiment of the pane (I) according to the invention. A 14×12 $mm^2$ intermediate layer (3) with cyanoacrylate had a thickness of 250 μm. The electrical connection element (4) was a 0.8-mm-thick copper plate with an area of 14×20 $mm^2$. The electrical connection element (4) extended beyond the intermediate layer (3) on two side faces by 4 mm each and was slightly curved toward the glass pane (1). The intermediate layer (3), the curved electrical connection element (4), and the electrically conductive structure (2) formed hollow spaces (5) on the two side faces. The hollow spaces (5) were partially filled with an electrically conductive mass (7). The electrically conductive mass (7) was a solder with 67 wt.-% bismuth and 33 wt.-% indium with a solidus temperature of 110° C. The electrically conductive mass (7) formed a concave meniscus inside the hollow space (5). The intermediate layer (3) with a rounded edge toward the electrically conductive structure (2) was completely wetted by the electrically conductive mass (7). The electrically conductive mass (7) formed very small wetting angles with the curved electrical connection element (4) and the electrically conductive structure (2). The electrically conductive mass (7) was arranged completely inside the hollow spaces (5). In a top view toward the pane (I), no electrically conductive mass (7) was visible. The electrical connection element (4) was durably connected electrically via the electrically conductive mass (7) to the electrically conductive structure (2). The electrical connection element (4) was adhered mechanically and durably connected via the intermediate layer (3) to the glass pane (1). Because of the shape and the viscosity of the electrically conductive mass (7), the mechanical stresses were completely conducted via the intermediate layer (3). Critical forces between the electrical connection element (4) and the glass pane (1) were not observed during production and during use.

FIG. 9 depicts a continuation of the exemplary embodiment of FIG. 1. The hollow spaces (5) were connected via connection cavities (8) with the diameter of roughly 100 μm to each other and to the outside edge of the intermediate layer (3). An electrically conductive mass (7) was not present in the connection cavities (8). The electrically conductive mass (7), liquid during the soldering procedure, wetted inside the hollow spaces (5). Expanded air or gaseous soldering aids during the soldering process could emerge from the all spaces (5) via the connection cavities (8). Thus, an improved distribution of the electrically conductive mass (7) inside the hollow spaces (5) was obtained.

FIG. 10 shows in detail a flow diagram of an exemplary embodiment according to the invention for the production of a pane (I) according to the invention.

The panes (I) according to the invention last longer compared to the prior art.

LIST OF REFERENCE CHARACTERS (I) Pane
(1) Glass pane
(2) Electrically conductive structure
(3) Intermediate layer
(4) Electrical connection element
(5) Hollow space, gap in the intermediate layer
(5*a*) Upper region of the hollow space (5), facing the electrical connection element (4)
(5*c*) Lower region of the hollow space (5), facing the electrically conductive structure (2)
(7) Electrically conductive mass
(8) Connection cavity

The invention claimed is:

1. A glass pane arrangement, comprising:
- a vehicle or architectural silicate glass pane;
- an electrically conductive structure applied on the vehicle or architectural silicate glass pane;
- at least one intermediate layer applied on the electrically conductive structure; and
- at least one electrical connection element applied on the intermediate layer,
  - wherein the intermediate layer, the at least one electrical connection element, and the electrically conductive structure form at least one hollow space, the at least one hollow space comprising an electrically conductive mass,
  - wherein the at least one electrical connection element is mechanically connected with the vehicle or architectural silicate glass pane via the at least one intermediate layer such that any mechanical stresses are completely conducted through the at least one intermediate layer, and
  - wherein the at least one electrical connection element is electrically connected to the at least one electrically conductive structure via the electrically conductive mass, the electrically conductive mass being liquid or having low viscosity selected such that no critical forces are transmitted by the electrically conductive mass from the at least one electrical connection element to the at least one electrically conductive structure.

2. The glass pane arrangement according to claim 1, wherein the electrically conductive mass is arranged inside the at least one hollow space.

3. The glass pane arrangement according to claim 1, wherein the at least one hollow space is completely surrounded by the intermediate layer.

4. The glass pane arrangement according to claim 1, wherein the intermediate layer has a thickness of 0.5 μm to 1 mm, 10 μm to 500 μm, or 100 μm to 300 μm.

5. The glass pane arrangement according to claim 1, wherein the at least one hollow space has a diameter or area equivalent of 0.1 mm to 2 mm, or 0.2 mm to 1 mm.

6. The glass pane arrangement according to claim 1, wherein the at least one hollow space has a diameter or area equivalent of 2 mm to 25 mm, 3 mm to 10 mm, or 7.5 mm to 8.5 mm.

7. The glass pane arrangement according to claim 1, wherein the intermediate layer comprises: polymers, ceramic screen printing pastes, solder resists, and/or adhesive strips.

8. The glass pane arrangement according to claim 1, wherein the intermediate layer further comprises connection cavities and a plurality of hollow spaces, the plurality of hollow spaces being connected via connection cavities to each other and/or to an edge of the intermediate layer.

9. The glass pane arrangement according to claim 1, wherein the electrically conductive mass comprises metal alloy, and/or composite materials.

10. The glass pane arrangement according to claim 9, wherein the metal alloys-include at least one material selected from silver, tin, zinc, indium, bismuth, and gallium.

11. The glass pane arrangement according to claim 9, wherein the metal alloys-include at least one material selected from 60 wt.-% to 98 wt.-% gallium, 15% wt.-% to 70% wt.-% indium, 50 wt.-% to 98 wt.-% tin, 10 wt.-% to 80 wt.-% zinc, 2 wt.-% to 10 wt.-% silver, and 30 wt.-% to 70 wt.-% bismuth.

12. The glass pane arrangement according to claim 1, wherein the electrically conductive mass with a solidus temperature of greater than 65° C. includes a 60 wt.-% to 98 wt.-% gallium.

13. A method comprising: using the glass pane arrangement according to claim 1, in a motor vehicle glazing on land, in a motor vehicle glazing on water, in a motor vehicle glazing extraterrestrially, or in a motor vehicle glazing in the air.

14. The glass pane arrangement according to claim 1, wherein the intermediate layer comprises: polyacrylate, cyanoacrylate, methyl methacrylate, silane and siloxane cross-linking polymers, epoxy resin, polyurethane, polychloroprene, polyamide, acetate, silicone adhesive, polyethylene, polypropylene, polyvinyl chloride, polyamide, polycarbonate, polyethylene terephthalate, polyethylene naphthalate, polyimides, polytetrafluoroethylene, polyethylene terephthalate, polyetherimides, polybenzimidazoles, thermally hardenable adhesives, their copolymer, and/or mixtures thereof.

15. The glass pane arrangement according to claim 1, wherein the intermediate layer comprises: polyimides or polytetrafluoroethylene.

16. The glass pane arrangement according to claim 1, wherein the electrically conductive mass has a solidus temperature less than 158° C.

17. The glass pane arrangement according to claim 1, wherein the electrically conductive structure comprises a metal containing silk screen paste printed on the vehicle or architectural silicate glass plane forming a heating conductor.

18. A method for producing a glass pane arrangement, comprising:
- providing a vehicle or architectural silicate glass pane;
- applying an electrically conductive structure on the vehicle or architectural silicate glass pane;
- applying an intermediate layer on the electrically conductive structure;

applying an electrically conductive mass on the electrical connection element or on the electrically conductive structure, the electrically conductive mass being liquid or having low viscosity;

after the electrically conductive structure is applied to the vehicle or architectural silicate glass pane, mechanically connecting the electrical connection element to the vehicle or architectural silicate glass pane via the intermediate layer such that any mechanical stresses from the electrical connection element are completely conducted through the intermediate layer to the electrically conductive structure or to the vehicle or architectural silicate glass pane or to both the electrically conductive structure and the vehicle or architectural silicate glass pane; and electrically connecting the electrically conductive mass within a hollow space formed in the intermediate layer to the electrical connection element and the electrically conductive structure.

19. The method according to claim 18, wherein the electrically conductive mass is applied on the electrical connection element.

20. The method according to claim 18, wherein the intermediate layer is applied on the electrical connection element by means of at least one of: screen printing, spraying, curtain coating, roller coating, adhesive strip application, or adhesive bonding.

21. The method according to claim 18, wherein applying an electrically conductive mass includes applying a material having a solidus temperature less than 158° C.

22. The method according to claim 18, wherein applying an electrically conductive structure on the vehicle or architectural silicate glass pane includes printing a metal containing silk screen paste on the vehicle or architectural silicate glass pane to form an electrically conductive structure being a heating conductor.

23. A pane comprising:

an electrically conductive structure applied on a glass pane;

at least one intermediate layer applied on the electrically conductive structure; and at least one electrical connection element applied on the intermediate layer, wherein the intermediate layer, the at least one electrical connection element, and the electrically conductive structure form at least one hollow space, the at least one hollow space comprising an electrically conductive mass, the electrically conductive mass being liquid or having low-viscosity or having high-ductility, wherein the at least one electrical connection element is mechanically connected with the glass plane via the at least one intermediate layer and the electrically conductive mass, and wherein the electrically conductive mass with a solidus temperature of greater than 65° C. includes a 60 wt.-% to 98 wt.-% gallium.

24. A method for producing a glass pane arrangement, comprising:

providing a vehicle or architectural silicate glass pane;

applying an electrically conductive structure on the vehicle or architectural silicate glass pane;

after the electrically conductive structure is applied to the vehicle or architectural silicate glass pane, applying an intermediate layer on an electrical connection element;

applying an electrically conductive mass on the electrical connection element or the electrically conductive structure, the electrically conductive mass being liquid or having low viscosity;

after the electrically conductive structure is applied to the vehicle or architectural silicate glass pane, mechanically connecting the intermediate layer to the vehicle or architectural silicate glass pane such that any mechanical stresses from the electrical connection element are completely conducted through the intermediate layer to the electrically conductive structure or to the vehicle or architectural silicate glass pane or to both the electrically conductive structure and the vehicle or architectural silicate glass pane; and electrically connecting the electrically conductive mass within a hollow space formed in the intermediate layer to the electrical connection element and the electrically conductive structure.

25. The method according to claim 24, wherein applying an electrically conductive structure on the vehicle or architectural silicate glass pane includes printing a metal containing silk screen paste on the vehicle or architectural silicate glass pane to form an electrically conductive structure being a heating conductor.

26. An apparatus, comprising:

a vehicle or architectural silicate glass pane;

an electrically conductive structure comprising a metal containing silk screen paste printed on the vehicle or architectural silicate glass plane forming a heating conductor;

an electrical connection element; and an intermediate layer positioned between the electrically conductive structure and the electrical connection element, the intermediate layer formed with at least one hollow space containing an electrically conductive mass being liquid or having low viscosity.

27. A method, comprising:

providing a vehicle or architectural silicate glass pane;

printing a metal containing silk screen paste on the vehicle or architectural silicate glass pane to form an electrically conductive structure being a heating conductor;

after the electrically conductive structure is formed on the vehicle or architectural silicate glass pane, applying an intermediate layer on the electrically conductive structure;

applying an electrically conductive mass on the electrical connection element or on an electrically conductive structure, the electrically conductive mass being liquid or having low viscosity; and after the electrically conductive structure is formed on the vehicle or architectural silicate glass pane, mechanically connecting the electrical connection element to the vehicle or architectural silicate glass pane via the intermediate layer such that the electrically conductive mass is disposed within at least one hollow space in the intermediate layer.

28. A method, comprising:

providing a vehicle or architectural silicate glass pane;

applying a metal containing silk screen paste on the vehicle or architectural silicate glass pane to form an electrically conductive structure being a heating conductor;

applying an intermediate layer on an electrical connection element;

applying an electrically conductive mass on the electrical connection element, the electrically conductive mass being liquid or having low viscosity; and after the electrically conductive structure is formed on the vehicle or architectural silicate glass pane, mechanically connecting the intermediate layer to the vehicle or architectural silicate glass pane such that the electrically conductive mass is disposed within at least one hollow space in the intermediate layer.

* * * * *